(12) United States Patent
Shiozawa et al.

(10) Patent No.: US 8,008,939 B2
(45) Date of Patent: Aug. 30, 2011

(54) COMPONENT TEST APPARATUS AND COMPONENT TRANSPORT METHOD

(75) Inventors: Masakuni Shiozawa, Chino (JP); Hiroaki Fujimori, Suwa (JP)

(73) Assignee: Seiko Epson Corporation (JP)

( * ) Notice: Subject to any disclaimer, the term of this patent is extended or adjusted under 35 U.S.C. 154(b) by 262 days.

(21) Appl. No.: 12/396,509

(22) Filed: Mar. 3, 2009

(65) Prior Publication Data
US 2009/0232626 A1 Sep. 17, 2009

(30) Foreign Application Priority Data
Mar. 11, 2008 (JP) .................................. 2008-061452

(51) Int. Cl.
*G01R 31/20* (2006.01)
(52) U.S. Cl. .................................................. 324/757.01
(58) Field of Classification Search ......................... None
See application file for complete search history.

(56) References Cited

U.S. PATENT DOCUMENTS

| | | | |
|---|---|---|---|
| 6,518,745 B2 | 2/2003 | Kim et al. | |
| 7,023,197 B2 * | 4/2006 | Jung | 324/757.01 |
| 7,464,807 B2 * | 12/2008 | Ham et al. | 198/468.3 |
| 7,479,779 B2 * | 1/2009 | Kikuchi et al. | 324/750.23 |
| 2008/0042667 A1 * | 2/2008 | Yamashita et al. | 324/754 |

FOREIGN PATENT DOCUMENTS

| | | |
|---|---|---|
| JP | 64-009378 | 1/1989 |
| JP | 05-081749 | 11/1993 |
| JP | 06-065335 | 9/1994 |
| JP | 06-293434 | 10/1994 |
| JP | 08-292233 | 11/1996 |
| JP | 2002-148307 | 5/2002 |
| JP | 2002-196042 | 7/2002 |

* cited by examiner

*Primary Examiner* — Ha Tran T Nguyen
*Assistant Examiner* — Arleen M Vazquez
(74) *Attorney, Agent, or Firm* — Harness, Dickey & Pierce, P.L.C.

(57) ABSTRACT

A component test apparatus performing a test on an electronic component is disclosed. The component test apparatus includes a component loading device, a transport hand, and a component unloading device. A plurality of functional stations have mutually different functions and are spaced apart at equal intervals along a movement direction of the transport hand. The transport hand has a plurality of index units that are capable of holding the electronic component independently from one another and operating independently from one another. The index units are spaced apart at intervals equal to the intervals at which the functional stations are spaced apart along a transport direction of the electronic component from a loading position toward a test position.

8 Claims, 9 Drawing Sheets

Fig.5A
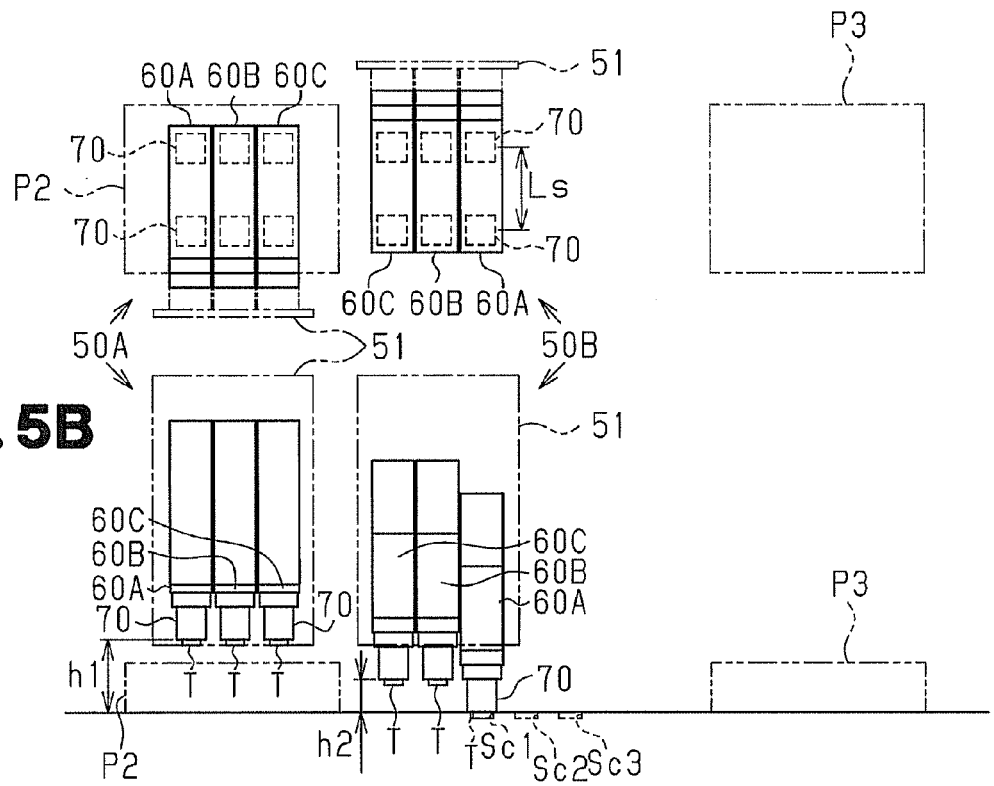
Fig.5B
Fig.6A
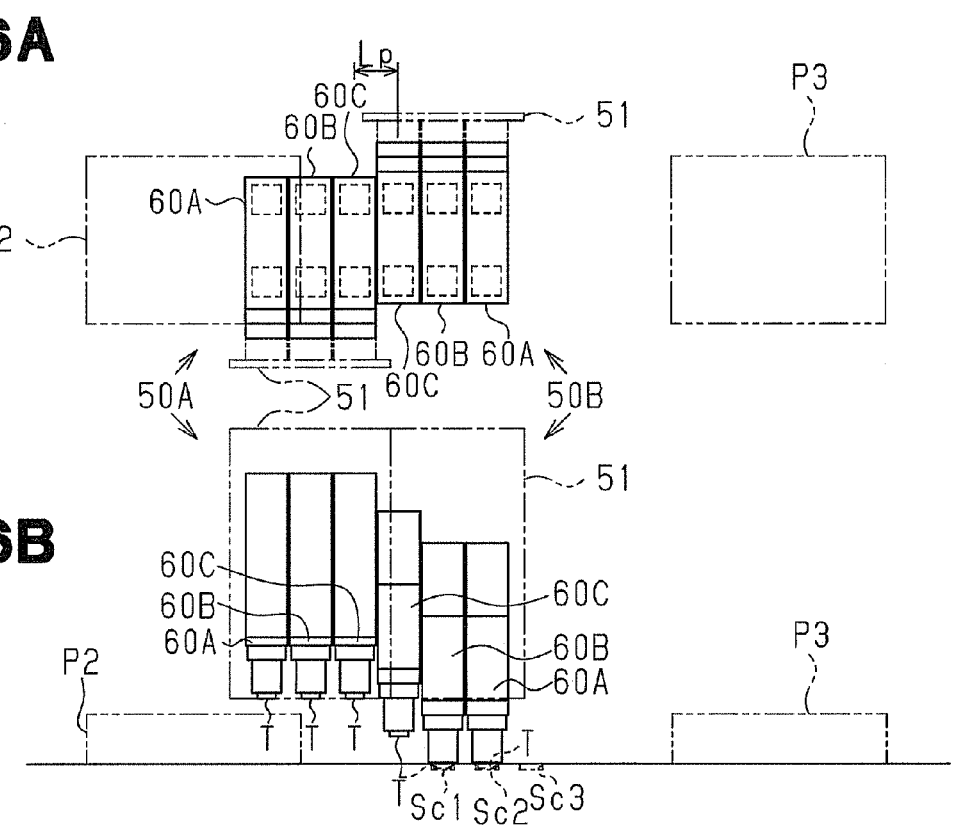
Fig.6B

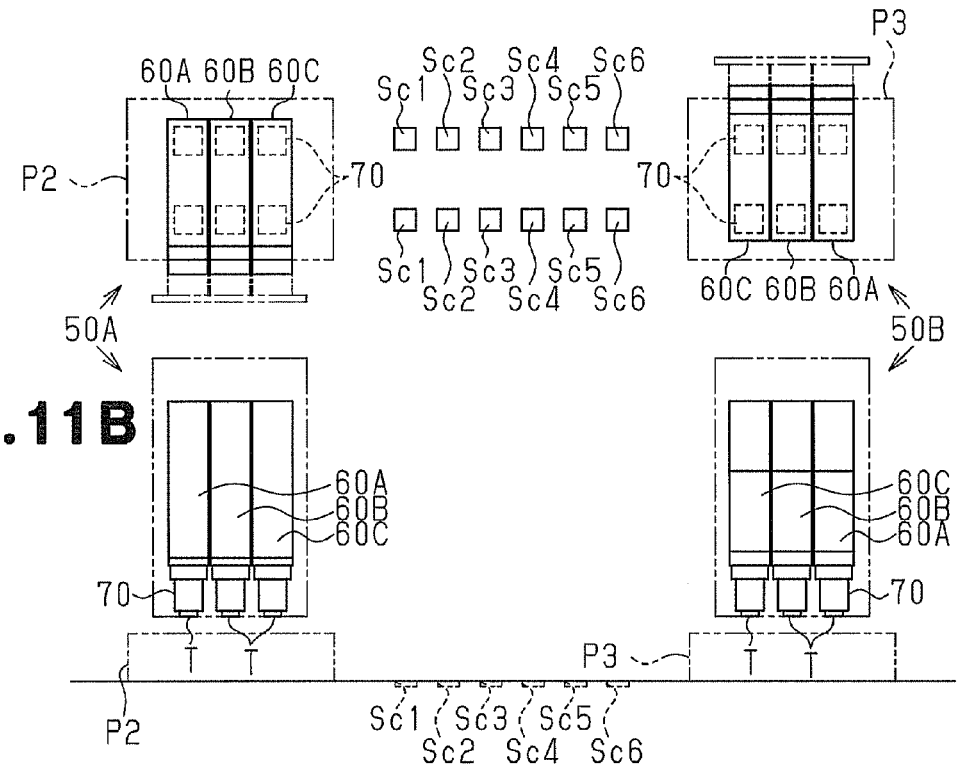
Fig.11A
Fig.11B
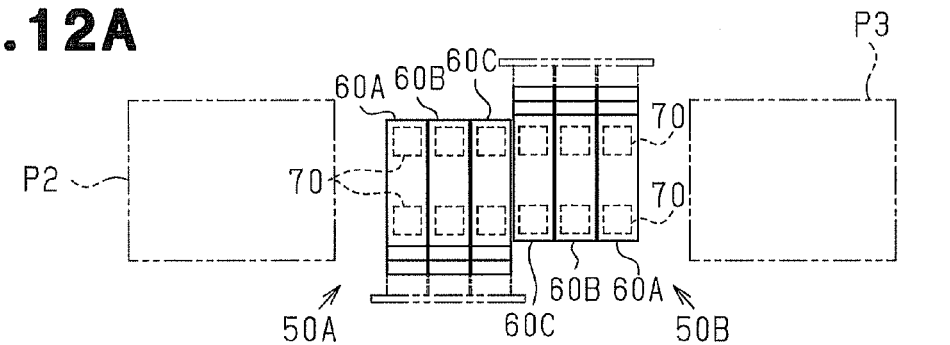
Fig.12A
Fig.12B

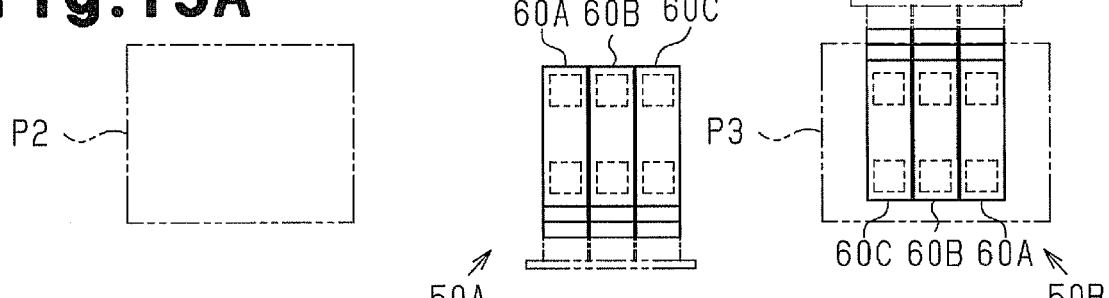
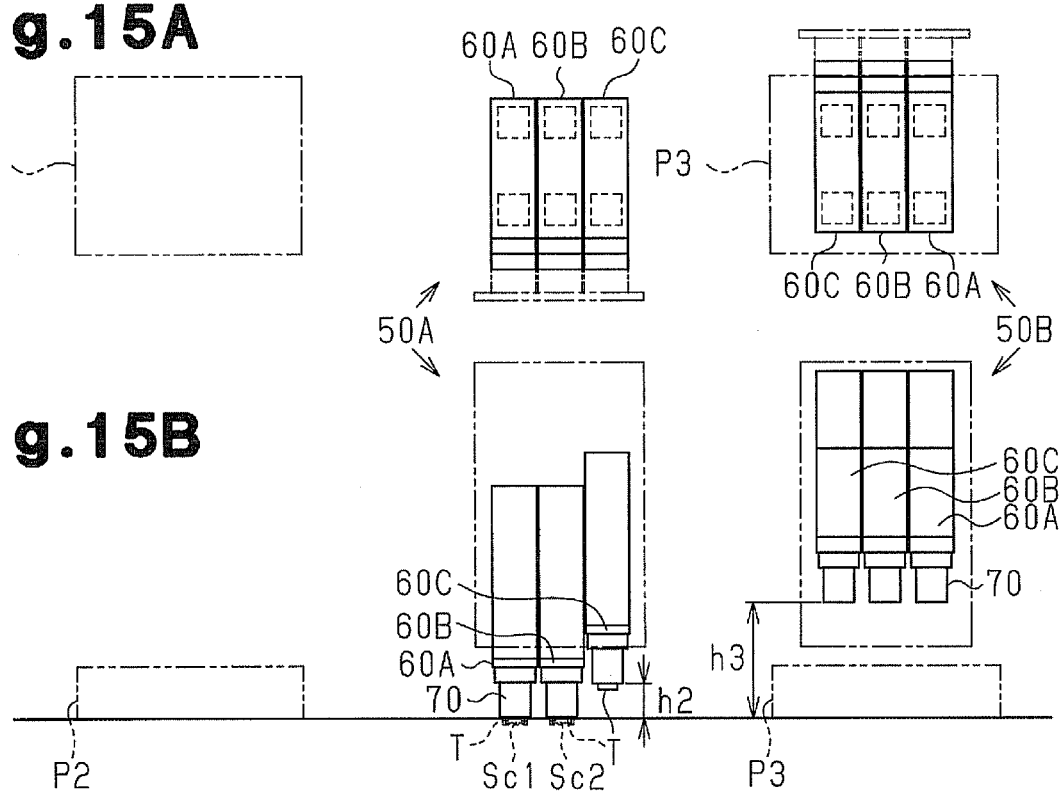

US 8,008,939 B2

COMPONENT TEST APPARATUS AND COMPONENT TRANSPORT METHOD

CROSS-REFERENCE TO RELATED APPLICATION

This application is based upon and claims the benefit of priority from prior Japanese Patent Application No. 2008-061452 filed on Mar. 11, 2008, the entire content of which is incorporated herein by reference.

BACKGROUND

1. Technical Field

The present invention relates to a component test apparatus that tests electronic components such as semiconductor chips and to a component transport method by which components are transported using the component test apparatus.

2. Related Art

Typically, various tests are performed on an electronic component such as a semiconductor chip when the electronic component is manufactured. The tests normally involve the use of a component test apparatus referred to as an IC handler. The component test apparatus has a plurality of transport devices that transport an electronic component, or a test subject, to predetermined positions (which are, for example, a loading position, a test position, and an unloading position) in the component test apparatus. Through the transport devices, the electronic component is supplied to the component test apparatus and arranged in a test socket provided in the component test apparatus before a test is carried out. After the test is completed, the transport devices remove the electronic component from the test socket and unload the electronic component from the component test apparatus. Specifically, for example, an electronic component to be tested is mounted on a shuttle by a loading robot serving as one such transport device. The shuttle then carries the electronic component to be tested to a position in the vicinity of the test socket. At this position, a measurement robot (a transport hand) serving as another transport device holds the electronic component up from the shuttle, transports the electronic component to the test socket, and arranges the electronic component in the test socket. After the test is completed, the measurement robot holds the electronic component up from the test socket and mounts the electronic component onto the shuttle. The shuttle then transports the electronic component that has been tested to a position in the vicinity of a collection robot serving as another transport device. Afterwards, the collection robot then holds the electronic component and mounts the electronic component on a collection tray that corresponds to the result of the test.

For example, Japanese Laid-Open Patent Publication No. 2002-148307 discloses an example of the component test apparatus. According to the apparatus of the publication, the component test apparatus, which is an IC handler, includes a plurality of test sockets aligned along a line and multiple pairs of transport hands. Each pair of the transport hands are arranged in such a manner as to straddle the corresponding one of the test sockets. Each of the transport hands has a suction mechanism that pulls and holds an electronic component and a pressing mechanism that presses the electronic component into a test socket.

The alignment of the test sockets is not fixed but changed as needed in correspondence with the content of the test performed on electronic components or the size of each electronic component. Also, the contents of the tests carried out in the test sockets are not necessarily common for all test sockets. That is, a single socket or certain groups of sockets may be used for different test. Further, depending on the contents of the tests, a test socket shaped unlike a typical socket is employed. In this regard, test sockets may be referred to as functional stations. However, in the transport hand of the above publication, the suction mechanism and the pressing mechanism are arranged in correspondence with the test sockets that are aligned along a line. The transport hand thus cannot adapt to changes of electronic components to be tested or contents of tests.

SUMMARY

Accordingly, it is an objective of the present invention to provide a component test apparatus and a component transport method capable of transporting electronic components quickly to functional stations that change forms such as alignment patterns in correspondence with the content of a test, by ensuring high flexible transport and arrangement of the electronic components by means of a transport hand.

To achieve the foregoing objective and in accordance with a first aspect of the present invention, a component test apparatus performing a test on an electronic component is provided. The apparatus includes a component loading device, a transport hand, and a component unloading device. The component loading device loads the electronic component to a loading position. The transport hand is capable of holding the electronic component so as to transport the electronic component from the loading position to a plurality of functional stations arranged a test position, and to transport the tested electronic component from the functional stations to an unloading position. The component unloading device unloads the electronic component from the unloading position. The functional stations have mutually different functions and are spaced apart at equal intervals along a movement direction of the transport hand. The transport hand includes a plurality of index units each one of which is capable of holding the electronic component and operating independently from the other ones of the index units. The index units are spaced apart at intervals equal to the intervals at which the functional stations are spaced apart along a transport direction of the electronic component from the loading position toward the test position.

In accordance with a second aspect of the present invention, a component transport method carried out by a component test apparatus that performs a test on an electronic component is provided. The component test apparatus includes a component loading device, a transport hand, and a component unloading device. The component loading device loads the electronic component to a loading position. The transport hand is capable of holding the electronic component so as to transport the electronic component from the loading position to a plurality of functional stations located at a test position, and to transport the tested electronic component from the functional stations to an unloading position. The component unloading device unloads the electronic component from the unloading position. The method includes: arranging the functional stations having mutually different functions to be spaced apart at equal intervals along a movement direction of the transport hand; providing, in the transport hand, a plurality of index units that are capable of holding the electronic component independently from one another and operating independently from one another; arranging a first electronic component held by a first index unit of the index units in a first functional station of the functional stations; performing the test on the first electronic component arranged in the first functional station; moving the transport hand along the movement direction by a distance equal to the interval between each adjacent pair of the functional stations after the test; and arranging a second electronic component held by a second index unit adjacent to the first index unit in the first functional station, and arranging the first electronic component held by the first index unit in a second functional station adjacent to the first functional station.

In accordance with a third aspect of the present invention, a component transport method carried out by a component test apparatus that performs a test on an electronic component is provided. The component test apparatus includes a component loading device, two transport hands, and a component unlading device. The component loading device loads the electronic component to a loading position. Two transport hands are each capable of holding the electronic component so as to transport the electronic component from the loading position to a plurality of functional stations located at a test position, and to transport the tested electronic component from the functional stations to an unloading position. The component unloading device unloads the electronic component from the unloading position. The method includes: arranging the functional stations having identical functions to be spaced apart at equal intervals along a movement direction of the transport hands; providing, in each transport hand, a plurality of index units that are capable of holding the electronic component independently from one another and operating independently from one another, the index units of each transport hand being spaced apart at intervals equal to the intervals at which the functional stations are spaced apart along a transport direction of the electronic component from the loading position to the test position; assigning the electronic components held by the two transport hands to the functional stations; and arrange the electronic components held by the two transport hands in the functional stations to which the electronic component have been assigned through cooperation of the two transport hands.

In accordance with a fourth aspect of the present invention, a component transport method carried out by a component test apparatus that performs a test on an electronic component is provided. The component test apparatus includes a component loading device, a transport hand, and a component unloading device. The component loading device loads the electronic component to a loading position. The transport hand is capable of holding the electronic component so as to transport the electronic component from the loading position to a plurality of functional stations located at a test position, and to transport the tested electronic component from the functional stations to an unloading position. The component unloading device unloads the electronic component from the unloading position. The method includes: arranging the functional stations having identical functions to be spaced apart at equal intervals along a movement direction of the transport hand; providing, in the transport hand, a plurality of index units that are capable of holding the electronic component independently from one another and operating independently from one another; holding a greater number of electronic components than the functional stations by means of the index units; and arranging, through independent operations of one or more of the index units that correspond to one or more of the functional stations, the electronic components held by said one or more of the index units in the corresponding functional stations.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawing in which:

FIG. 5A is a plan view illustrating transport of an electronic component by the component test apparatus of FIG. 1;

FIG. 5B is a front view of FIG. 5A;

FIG. 6A is a plan view illustrating transport of an electronic component by the component test apparatus of FIG. 1;

FIG. 6B is a front view of FIG. 6A;

FIG. 11A is a plan view illustrating transport of electronic components by a component test apparatus according to a second embodiment of the present invention;

FIG. 11B is a front view of FIG. 11A;

FIG. 12A is a plan view illustrating transport of electronic components by the component test apparatus of FIG. 12A;

FIG. 12B is a front view of FIG. 12A;

FIG. 15A is a plan view illustrating transport of electronic components by the component test apparatus shown in FIG. 13A; and FIG. 15B is a front view of FIG. 15A.

DESCRIPTION OF EXEMPLARY EMBODIMENTS

Figure 1:
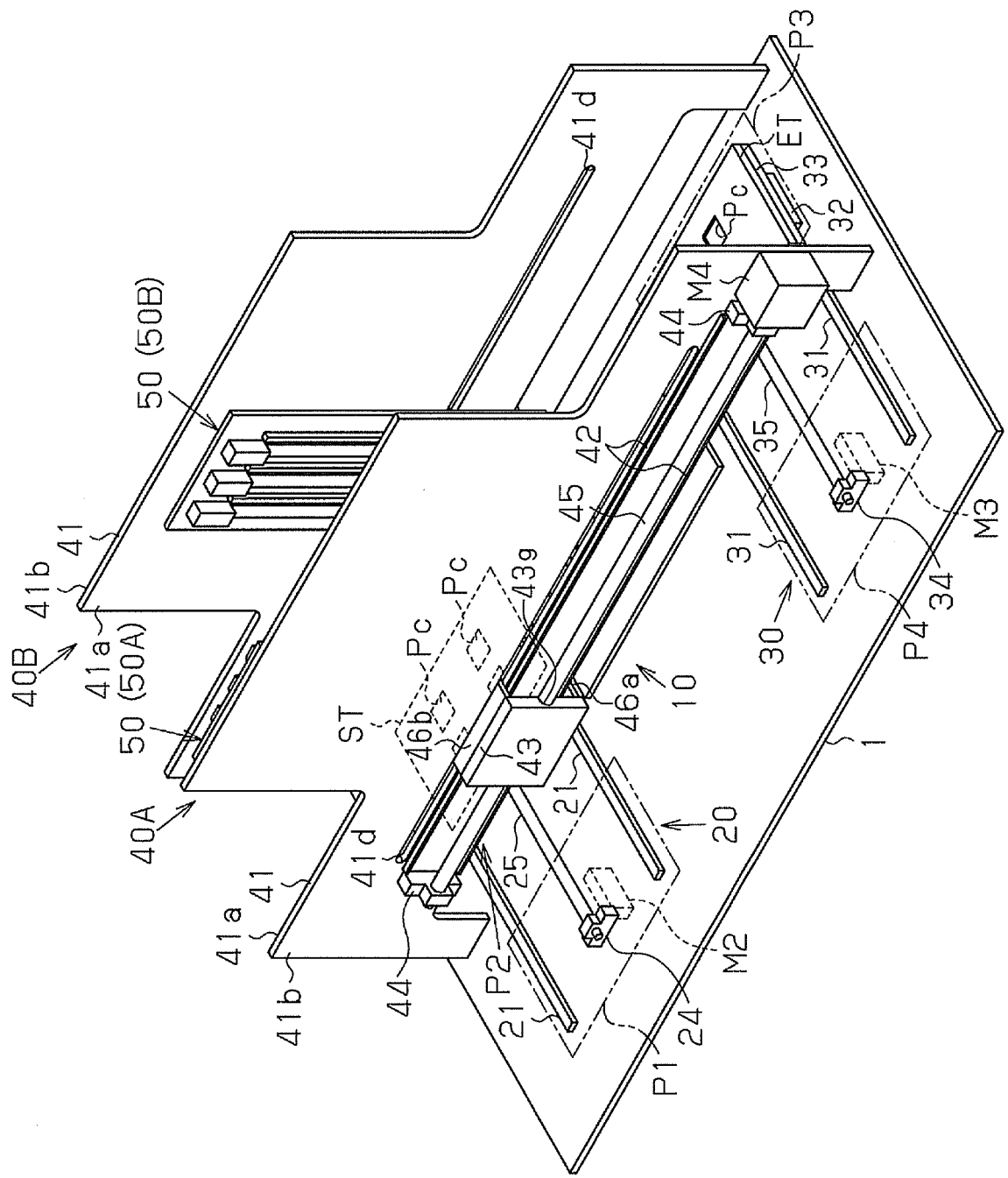
FIG. 1 is a perspective view showing a component test apparatus according to a first embodiment of the present invention.

One embodiment of the present invention will now be described with reference to FIGS. 1 to 10B. FIG. 1 is a perspective view showing a component test apparatus according to the embodiment.

As shown in FIG. 1, the component test apparatus of the present embodiment has a substantially rectangular base 1. A component test portion 10, which is also formed substantially in a rectangular shape, is arranged on the top surface of the base 1 at a position at the longitudinal center of the base 1 and in a rear position with respect to a direction (a width direction) perpendicular to the longitudinal direction. A component loading device 20 serving as component loading means is formed on the top surface of the base 1 at one side (the left side as viewed in FIG. 1) along the longitudinal direction of the component test portion 10. A component unloading device 30 serving as component unloading means is provided on the top surface of the base 1 at the other side (the right side as viewed in FIG. 1) along the longitudinal direction of the component test portion 10.

Figure 2:
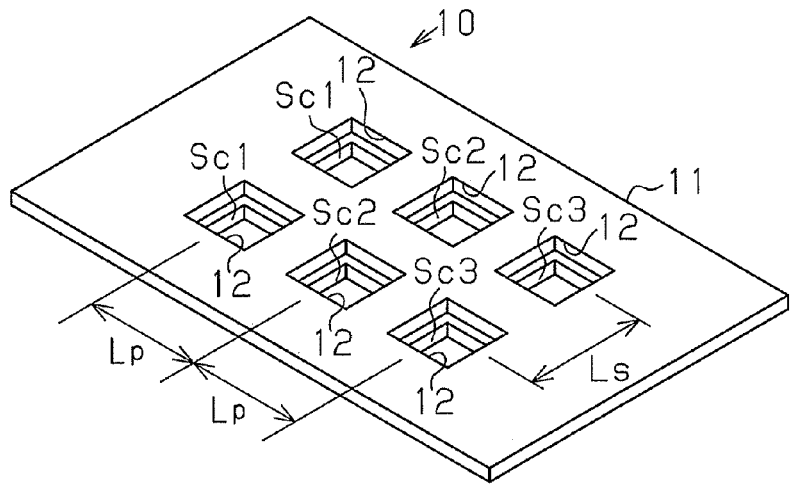
FIG. 2 is a perspective view showing a component test portion of the component test apparatus illustrated in FIG. 1.

As shown in FIG. 2, the component test portion 10 has an upper support body 11 having a substantially rectangular shape and a lower support body (not shown) also having a substantially rectangular shape, which is arranged below the upper support body 11. The lower support body is sized slightly smaller than the upper support body 11. The upper support body 11 has six through holes 12. Specifically, in the upper support body 11, each pair of through holes 12 are aligned in the direction of the width of the upper support body 11. That is, three of the through holes 12, one from each pair, are aligned along the longitudinal direction of the upper support body 11. The centers of the through holes 12 are spaced apart at intervals Lp in the longitudinal direction of the upper support body 11 and at intervals Ls in the width direction of the upper support body 11. In the lower support body, first test sockets Sc1 each serving as a functional station are provided at the positions corresponding to the pair of through holes 12 that are located leftmost in the longitudinal direction. Second test sockets Sc2 each serving as a functional station are arranged at the positions corresponding to the pair of through holes 12 that are formed rightward from the aforementioned pair of through holes 12. Third test sockets Sc3 each serving as a functional station are provided at the positions corresponding to the two through holes 12 that are located rightmost in the longitudinal direction. In the first embodiment, each of the first test sockets Sc1 are also referred to as a first station, each of the second test sockets Sc2 are also referred to as a second station, and each of the third test sockets Sc3 are also referred to as a third station.

Figure 3:
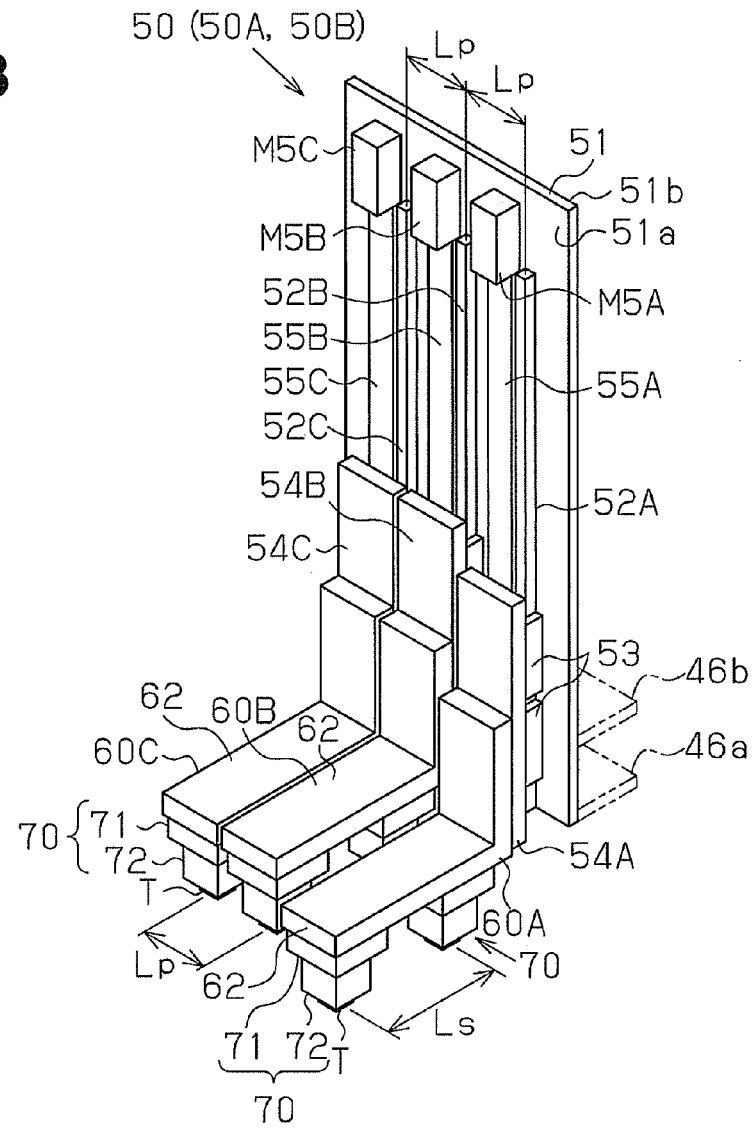
FIG. 3 is a perspective view showing a transport hand of the component test apparatus illustrated in FIG. 1.
Figure 4:
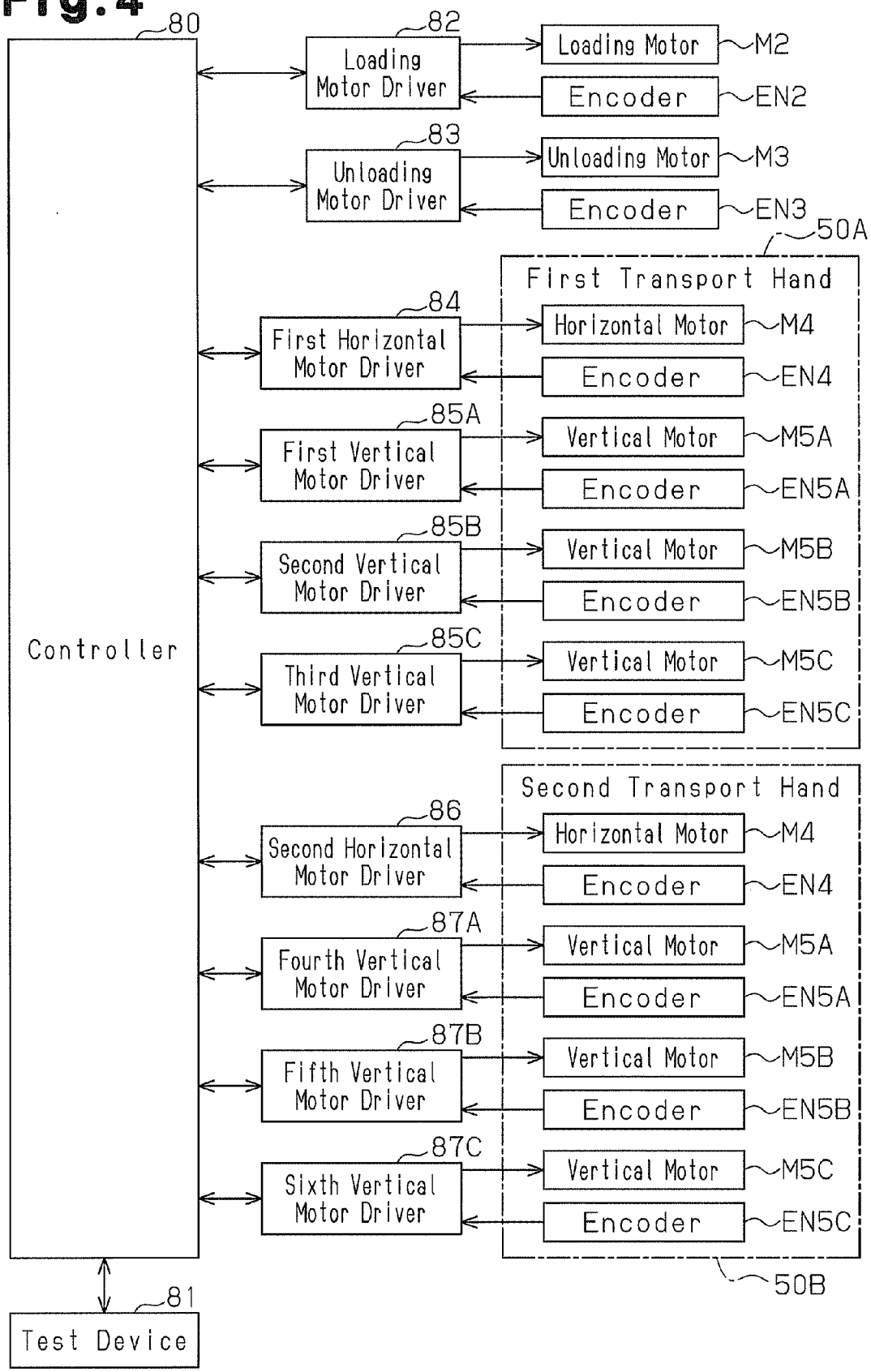
FIG. 4 is a block diagram representing the electric configuration related to the control system of the transport hand of the component test apparatus illustrated in FIG. 1.

Each one of the test sockets Sc1 to Sc3 electrically connects an electronic component T (see FIG. 3) received by the test socket Sc1 to Sc3 to a test device 81 (see FIG. 4). Specifically, each one of the test sockets Sc1 to Sc3 includes a plurality of non-illustrated contact pins corresponding to a plurality of non-illustrated connection pins provided in the corresponding one of the electronic components T. The contact pins are connected electrically to the corresponding terminals of the test device 81, which performs electrical tests on the electronic component T. The test device 81 carries out prescribed first, second, and third electrical tests on the electronic component T. When the electronic component T is received by the corresponding test socket Sc1 to Sc3, the connection pins of the electronic component T are electrically connected to the corresponding contact pins. This allows the test device 81 to perform the electrical tests on the electronic component T. In the first embodiment, the contents of the electrical tests performed on the electronic component T differ from one functional station to another. That is, the first test is performed in the test sockets Sc1, the second test is performed in the test sockets Sc2, and the third test is performed in the test sockets Sc3. The electrical tests are carried out in the order of the first test, the second test, and the third test.

The component loading device 20, as illustrated in FIG. 1, loads the electronic component T to be tested, which is mounted on a loading tray (not shown), from a position forward in the width direction of the base 1, which is a tray replacement position P1 spaced from the component test portion 10, to a position rearward in the width direction of the base 1, or a loading position P2 in the vicinity of the component test portion 10. Specifically, the component loading device 20 has a pair of rails 21 extending from the tray replacement position P1 to the loading position P2 along the width direction of the base 1. A tray support body (not shown) having a rail receiver (not shown), which moves on the rails 21, is mounted on the rails 21. The loading tray having a plurality of pockets Pc, which are to hold electronic components T, is mounted on the top surface of the tray support body. A ball screw 25 is provided between the rails 21 and extends parallel with the rails 21. Each end of the ball screw 25 is rotatably supported by a holder 24 secured to the base 1. A loading motor M2 is connected to the ball screw 25 and operates to rotate the ball screw 25 selectively in a forward direction and in a reverse direction. The ball screw 25 is threaded onto a ball screw receiver (not shown) arranged in the tray support body. As the ball screw 25 rotates in the forward or reverse directions, the tray support body reciprocates between the tray replacement position P1 and the loading position P2. In other words, the loading tray, on which the electronic component T to be tested is mounted, is arranged on the tray support body and reciprocated between the tray replacement position P1 and the loading position P2.

The component unloading device 30, which is illustrated in FIG. 1, unloads the electronic component T that has been tested and mounted on an unloading tray ET, from a position rearward in the width direction of the base 1, or an unloading position P3 in the vicinity of the component test portion 10, to a position forward in the width direction of the base 1, or a tray replacement position P4 spaced from the component test portion 10. Specifically, the component unloading device 30 has a pair of rails 31 extending from the tray replacement position P4 to the unloading position P3 along the width direction of the base 1. A tray support body 33 having a rail receiver 32, which moves on the rails 31, is mounted on the rails 31. An unloading tray ET having a plurality of pockets Pc, which are to hold electronic components T, is mounted on the top surface of the tray support body 33. A ball screw 35 is provided between the rails 31 and extends parallel with the rails 31. Each end of the ball screw 35 is rotatably supported by a holder 34 secured to the base 1. An unloading motor M3 is connected to the ball screw 35 and operates to rotate the ball screw 35 selectively in a forward direction and in a reverse direction. A ball screw receiver (not shown), which is provided in the tray support body 33, is threaded onto the ball screw 35. As the ball screw 35 rotates in the forward or reverse direction, the tray support body 33 reciprocates between the tray replacement position P4 and the unloading position P3. In other words, the unloading tray ET, on which the electronic component T that has been tested is mounted, is arranged on the tray support body 33 and reciprocated between the tray replacement position P4 and the unloading position P3.

The component test portions 10 including the test sockets Sc1 to Sc3, which are illustrated in FIG. 2, the loading position P2 in the component loading device 20, and the unloading position P3 in the component unloading device 30 are aligned along a line in the longitudinal direction of the base 1. Such alignment is referred to as a component transport line.

A first transport device 40A and a second transport device 40B are arranged on the base 1 to be opposed to each other at both sides of the component test portion 10 in the width direction of the base 1, or both sides of the component transport line in the width direction of the base 1. The first transport device 40A is located forward of the component transport line with respect to the width direction of the base 1. The second transport device 40B is arranged rearward of the component transport line with respect to the width direction of the base 1. The first and second transport devices 40A, 40B each include a plate-like transport hand support body 41, which extends perpendicular to the top surface of the base 1 and parallel with the component transport line. Each of the transport hand support bodies 41 includes an inner surface 41a facing the component test portion 10 and an outer surface 41b, which is located opposite to the inner surface 41a. In other words, the first and second transport devices 40A, 40B are arranged on the base 1 in such a manner that the inner surfaces 41a of the transport hand support bodies 41 of the transport devices 40A, 40B are opposed to each other. Each transport hand support body 41 are arranged in such a manner as to straddle the component loading device 20 and the component unloading device 30. A pair of rails 42, which extend parallel with the component transport line and have a length corresponding to the distance between the component loading device 20 and the component unloading device 30, are provided on the outer surface 41b of the transport hand support body 41 located forward in the width direction of the base 1. A horizontal movable body 43 is mounted on the rails 42 and moves horizontally on the rails 42 through a non-illustrated rail receiver moving on the rails 42. That is, the horizontal movable body 43 reciprocates along the rails 42 while guided through the rail receiver. A ball screw 45, which extends parallel with the rails 42, is provided between the rails 42. Both ends of the ball screw 45 are rotatably supported by two holders 44, which are secured to the outer surface 41b of the transport hand support body 41. One end of the ball screw 45 is connected to a horizontal motor M4, which operates to rotate the ball screw 45 selectively in a forward direction and in a reverse direction. A bearing portion 43g formed in the horizontal movable body 43 is threaded onto the ball screw 45. As the ball screw 45 rotates in the forward or reverse directions, the horizontal movable body 43 horizontally reciprocates between a position above the component loading device 20 and a position above the component unloading device 30.

The horizontal movable body 43 supports a transport hand 50, which is located at the side corresponding to the inner surface 41a of the transport hand support body 41, through a pair of horizontal joint bodies 46a, 46b aligned in a vertical direction. Specifically, the lower horizontal joint body 46a extends from a lower portion of the horizontal movable body 43 toward the inner surface 41a of the transport hand support body 41 through the space defined between the portion of the transport hand support body 41 straddling the component loading device 20 and the component unloading device 30, and the upper surface of the base 1. The upper horizontal joint body 46b extends from an upper portion of the horizontal movable body 43 toward the inner surface 41a of the transport hand support body 41 through a guide bore 41d that extends through the transport hand support body 41 and parallel with the rails 42. One transport hand 50 is connected to the distal ends of the two horizontal joint bodies 46a, 46b. This arrangement allows the transport hand 50 to horizontally reciprocate between the position above the component loading device 20 and the position above the component unloading device 30 as the horizontal movable body 43 moves in the horizontal direction.

As shown in FIG. 3, the transport hand 50 includes a vertical support body 51, which is shaped substantially as a vertically elongated rectangle. The distal ends of the horizontal joint bodies 46a, 46b are connected to a lower portion of the vertical support body 51. The vertical support body 51 includes an inner surface 51a facing the component test portion 10 and an outer surface 51b facing the corresponding transport hand support body 41. Three rails 52A, 52B, 52C, which extend vertically with respect to the base 1, are arranged on the inner surface 51a of the vertical support body 51 and spaced apart at equal intervals. Each adjacent pair of the rails 52A, 52B, 52C are spaced from each other by an interval Lp. Vertical movable bodies 54A, 54B, and 54C, each of which is movable in a vertical direction through a pair of rail receivers 53, are provided on the rails 52A, 52B, and 52C, respectively. Ball screws 55A, 55B, 55C, which extend parallel with the rails 52A, 52B, 52C, are also provided. Vertical motors M5A, M5B, and M5C, each of which operates independently, are connected to the upper ends of the ball screws 55A, 55B, and 55C, respectively. Each one of the vertical motors M5A, M5B, M5C operates to rotate the corresponding one of the ball screws 55A, 55B, 55C selectively in a forward direction and in a reverse direction. A ball screw receiver (not shown) formed in each one of the vertical movable bodies 54A, 54B, 54C is threaded onto the corresponding one of the ball screws 55A, 55B, 55C. In other words, each one of the vertical movable bodies 54A, 54B, 54C selectively ascends and descends along the corresponding one of the rails 52A, 52B, 52C as the associated one of the ball screws 55A, 55B, 55C rotates in the forward or reverse directions.

The vertical movable bodies 54A, 54B, and 54C include index units 60A, 60B, 60C, respectively. Each of the index units 60A, 60B, 60C includes a horizontal portion 62 extending perpendicular to an inner surface 51a of the vertical support body 51. Each one of the horizontal portions 62 is fixed to the corresponding one of the vertical movable bodies 54A, 54B, 54C. Specifically, the horizontal portion 62 of each index unit 60A, 60B, 60C includes a lower surface extending horizontally with respect to the component test portion 10 of the base 1. Each horizontal portion 62 has such a length that the horizontal portion 62 can face both of the test sockets Sc1 (Sc2, Sc3), the centers of which are spaced apart at the interval Ls. Accordingly, when the horizontal portion 62 of each index unit 60A, 60B, 60C is arranged at a test position at which the horizontal portion 62 faces the corresponding two test sockets Sc1 (Sc2, Sc3), the horizontal portion 62 selectively approaches and separates from the test sockets Sc1 (Sc2, Sc3) through selective ascent and descent of the corresponding vertical movable body 54A, 54B, 54C. In other words, when the horizontal portion 62 of any one of the index units 60A, 60B, 60C is located at a first test position, at which the horizontal portion 62 faces the two test sockets Sc1 (the first stations), the vertical movable body 54A, 54B, 54C corresponding to the horizontal portion 62 located at the first test position is selectively raised and lowered so that the vertical movable body 54A, 54B, 54C corresponding to the first test position is allowed to approach or separate from the test sockets Sc1 (the first stations). Similarly, when the horizontal portion 62 of any one of the index units 60A, 60B, 60C is located at a second test position at which the horizontal portion 62 faces the two test sockets Sc2 (the second stations), the vertical movable body 54A, 54B, 54C corresponding to the second test position is allowed to selectively approach and separate from the two test sockets Sc2 (the second stations). Also, when the horizontal portion 62 of any one of the index units 60A, 60B, 60C is located at a third test position at which the horizontal portion 62 faces the two test sockets Sc3 (the third stations), the vertical movable body 54A, 54B, 54C corresponding to the third test position is allowed to selectively approach and separate from the two test sockets Sc3 (the third stations).

As of the index units 60A, 60B, 60C, the index unit 60A, for example, includes two component holding portions 70 each serving as a holding mechanism, which is formed on the lower surface of the horizontal portion 62. The centers of the two component holding portions 70 are spaced apart at the interval Ls. Each of the component holding portions 70 holds the electronic component T arranged in the pocked Pc (see FIG. 1) of the loading tray ST at the loading position P2 (see FIG. 1) and presses the electronic component T into the corresponding test socket Sc1 to Sc3 (see FIG. 2) at the first to third test positions. At the unloading position P3 (see FIG. 1), each component holding portion 70 arranges the electronic component T in the pocket Pc of the unloading tray ET (see FIG. 1). The component holding portion 70 has a pressing mechanism 71 and a suction mechanism 72, which is selectively raised and lowered by the pressing mechanism 71. The pressing mechanism 71 is allowed to project the suction mechanism 72 downward through a pneumatic piston, which is provided in the pressing mechanism 71. As the suction mechanism 72 is projected, the electronic component T in the test socket Sc is firmly pressed against the test socket Sc, thus electrically connecting the connection pins of the electronic component T to the contact pins of the test socket Sc. The suction mechanism 72 is connected also to a non-illustrated negative pressure generating device. A suction bore (not shown), on which the negative pressure generated by the negative pressure generating device acts, is defined in the bottom surface of the suction mechanism 72. To allow the component holding portion 70 to hold the electronic component T up from the loading tray, the negative pressure is caused in the suction bore of the bottom surface of the suction mechanism 72. This draws and brings the electronic component T in contact with the bottom surface of the component holding portion 70. To mount the electronic component T held by the suction mechanism 72 on the unloading tray ET (see FIG. 1), the suction bore of the bottom surface of the suction mechanism 72 is disconnected from the negative pressure generating device so that the pressure in the suction bore reaches the atmospheric level. This releases the electronic component T.

In this configuration, it is particularly desirable that a total of six pockets Pc be provided in the loading tray ST and the unloading tray ET, with three pockets Pc provided along the longitudinal direction of the base 1 and spaced apart at the intervals Lp and two pockets Pc defined in the width direction of the base 1 and spaced apart at the interval Ls. Further, for example, a total of twelve pockets Pc may be provided in correspondence with the number of the transport hands, with each four of the pockets Pc spaced apart at the intervals Ls in the width direction of the base 1. Alternatively, a total of eighteen pockets Pc may be arranged with each six of the pockets Pc spaced apart at the intervals Ls as viewed along the width direction of the base 1. In these manners, the pockets Pc may be arranged in such a manner as to ensure flexible timings of loading and unloading. If the loading tray ST in which the pockets Pc are provided in this manner is employed, each of the first and second transport devices 40A, 40B move all the index units 60A, 60B, 60C of the transport hand 50 simultaneously at the loading position P2, thus causing the six component holding portions 70 to hold six electronic components T up from the loading tray. Also, if the unloading tray ET in which the pockets Pc are provided in this manner is employed, each of the first and second transport devices 40A, 40B moves all of the index units 60A, 60B, 60C of the transport hand 50 simultaneously at the unloading position P3, thus mounting the six electronic components T held by the component holding portions 70 on the unloading tray ET.

With reference to FIG. 4, the electric configuration of the component transport device will be explained. FIG. 4 is a block diagram representing the electric configuration of the transport hand 50. In the following description, the transport hand 50 formed in the first transport device 40A will be referred to as a first transport hand 50A, and the transport hand 50 provided in the second transport device 40B will be referred to as a second transport hand 50B.

As illustrated in FIG. 4, the controller 80 includes a microcomputer having a CPU, a ROM, and a RAM. The controller 80 controls operation of the transport hands 50A, 50B, including selective ascent and descent of the index units 60A, 60B, 60C, in accordance with various data and various control programs stored in the ROM and the RAM. For example, in a transport procedure of the electronic components T, the controller 80 controls movement of the transport hands 50A, 50B and the index units 60A, 60B, 60C of the transport hands 50A, 50B by carrying out a control program based on the locations of the test sockets Sc1 to Sc3 in the component test portion 10 and information regarding the test order, which are stored by the ROM and the RAM as data in advance. By changing the various data and the control programs, the control conditions and the control modes of the transport hands 50A, 50B and the index units 60A, 60B, 60C of each transport hand 50A, 50B are easily modified. For example, transport control of the electronic components T is easily changed in correspondence with change of the locations of the sockets in the component test portion 10 or change of the test content.

Referring to FIG. 4, the controller 80 of the first embodiment is electrically connected to the test device 81. When the controller 80 recognizes that the electronic components T are arranged in the test sockets Sc1 to Sc3 of the component test portion 10, the controller 80 outputs a signal indicating that tests are ready to the test device 81. In response to the signal from the controller 80, the test device 81 starts to perform a test on each electronic component T in accordance with the test socket in which the electronic component T is arranged. Each time the test on the electronic component T is completed, the test device 81 provides a signal indicating the completion of the test to the controller 80. When the tests on the electronic components T arranged in the test sockets Sc1 to Sc3 are all completed and the test device 81 outputs a signal indicating such completion to the controller 80, the controller 80 starts to transport the electronic components T by means of the transport hands 50A, 50B under prescribed control conditions.

A loading motor driver 82, an unloading motor driver 83, a first horizontal motor driver 84, a second horizontal motor driver 86, first to sixth vertical motor drivers 85A to 85C, and 87A to 87C are connected to the controller 80. When the controller 80 sends a drive command to the loading motor driver 82, the loading motor driver 82 rotates a loading motor M2, which moves the loading tray ST of the component loading device 20, in a forward direction or a reverse direction in response to the drive command. An encoder EN2, which detects the rotational angle of the loading motor M2, is provided in the loading motor M2. The encoder EN2 sends a rotational angle signal to the controller 80 through the loading motor driver 82. The controller 80 feedback-controls the movement amount of the loading tray ST based on the rotational angle signal of the encoder EN2.

When the controller 80 provides a drive command to the unloading motor driver 83, the unloading motor driver 83 rotates an unloading motor M3, which moves the unloading tray ET of the component unloading device 30, in a forward direction or a reverse direction in response to the drive command. An encoder EN3, which detects the rotational angle of the unloading motor M3, is provided in the unloading motor M3. The encoder EN3 sends a rotational angle signal to the controller 80 through the unloading motor driver 83. The controller 80 feedback-controls the movement amount of the unloading tray ET based on the rotational angle signal of the encoder EN3.

When the controller 80 provides a drive command to the first horizontal motor driver 84, the first horizontal motor driver 84 rotates a horizontal motor M4, which moves the horizontal movable body 43 of the first transport hand 50A, in a forward direction or a reverse direction in response to the drive command. An encoder EN4, which detects the rotational angle of the horizontal motor M4, is provided in the horizontal motor M4. The encoder EN4 sends a rotational angle signal to the controller 80 through the first horizontal motor driver 84. The controller 80 feedback-controls the movement amount of the horizontal movable body 43 of the first transport hand 50A based on the rotational angle signal of the first horizontal motor driver 84.

When the controller 80 provides a drive command to the first vertical motor driver 85A, the first vertical motor driver 85A rotates a vertical motor M5A, which moves the vertical movable body 54A of the first transport hand 50A, in a forward direction or a reverse direction in response to the drive command. An encoder EN5A, which detects the rotational angle of the vertical motor M5A, is provided in the vertical motor M5A. The encoder EN5A sends a rotational angle signal to the controller 80 through the first vertical motor driver 85A. The controller 80 feedback-controls the movement amount of the vertical movable body 54A, or the index unit 60A, of the first transport hand 50A, based on the rotational angle signal of the first vertical motor driver 85A.

When the controller 80 provides a drive command to the second vertical motor driver 85B, the second vertical motor driver 85B rotates a vertical motor M5B, which moves the vertical movable body 54B of the first transport hand 50A, in a forward direction or a reverse direction in response to the drive command. An encoder EN5B, which detects the rotational angle of the vertical motor M5B, is provided in the vertical motor M5B. The encoder EN5B sends a rotational angle signal to the controller 80 through the second vertical motor driver 85B. The controller 80 feedback-controls the movement amount of the vertical movable body 54B, or the index unit 60B, of the first transport hand 50A, based on the rotational angle signal of the second vertical motor driver 85B.

When the controller 80 provides a drive command to the third vertical motor driver 85C, the third vertical motor driver 85C rotates a vertical motor M5C, which moves the vertical movable body 54C of the first transport hand 50A, in a forward direction or a reverse direction in response to the drive command. An encoder EN5C, which detects the rotational angle of the vertical motor M5C, is provided in the vertical motor M5C. The encoder EN5C sends a rotational angle signal to the controller 80 through the third vertical motor driver 85C. The controller 80 feedback-controls the movement amount of the vertical movable body 54C, or the index unit 60C, of the first transport hand 50A, based on the rotational angle signal of the third vertical motor driver 85C.

The controller 80 controls the second transport hand 50B in the same manner as the first transport hand 50A. In other words, the controller 80 outputs a drive command to the second horizontal motor driver 86 so as to rotate a horizontal motor M4, which moves the horizontal movable body 43 of the second transport hand 50B, in a forward direction or a reverse direction. Also, the controller 80 provides drive commands to the fourth vertical motor driver 87A, the fifth vertical motor driver 87B, and the sixth vertical motor driver 87C so as to rotate a vertical motor M5A, a vertical motor M5B, and a vertical motor M5C, respectively, which move the corresponding vertical movable bodies 54A to 54C of the second transport hand 50B, in a forward direction or a reverse direction. Encoders EN4, EN5A, EN5B, and EN5C, each which detects the rotational angle of the corresponding one of the motors M4, M5A, M5B, and M5C, are provided in the motors M4, M5A, M5B, and M5C, respectively. The controller 80 feedback-controls the movement amount of the horizontal movable body 43 of the second transport hand 50B based on the rotational angle signal from the encoder EN4. Further, in response to the rotational angle signals from the encoders EN5A, EN5B, and EN5C, the controller 80 feedback-controls the movement amounts of the vertical movable bodies 54A, 54B, and 54C, or the index units 60A, 60B, and 60C, respectively, of the second transport hand 50B.

Subsequently, with reference to FIGS. 5A to 10B, a transport method of the electronic components T by the component test apparatus will be explained. Normally, the time necessary for the first test performed in the test sockets Sc1, the time necessary for the second test carried out in the test sockets Sc2, and the time necessary for the third test conducted in the test sockets Sc3 are different from one another. However, in the following description, these times are assumed to be equal for illustrative purposes. Further, in the first embodiment, the interval Lp will be referred to as one pitch.

First, as illustrated in FIGS. 5A and 5B, the second transport hand 50B is arranged at the first test position and the first transport hand 50A is located at the loading position P2. The two electronic components T (the first electronic components) that are held by the component holding portions 70 of the index unit 60A (the first index unit) of the second transport hand 50B, which is arranged at the first test position, are received by the test sockets Sc1 and subjected to an electrical test. On the other hand, the component holding portions 70 of the index units 60A, 60B, 60C of the first transport hand 50A hold the electronic components T that are maintained in a standby state for the test. At this stage, the component holding portion 70 of each index unit 60A, 60B, 60C of the first transport hand 50A is raised at a first height h1, at which the first transport hand 50A is allowed to move toward the test position. Afterwards, with the height of the component holding portions 70 of the first transport hand 50A maintained at the first height h1, the first transport hand 50A is moved toward the first test position. This brings the index unit 60C of the first transport hand 50A closer to the index unit 60C of the second transport hand 50B until these index units 60C are spaced apart by the interval Lp.

After a predetermined test time elapses and the first test on the two electronic components T, which are held by the index unit 60A of the second transport hand 50B, is completed, the electronic components T held by the index unit 60A are separated from the test sockets Sc1. As illustrated in FIGS. 6A and 6B, the second transport hand 50B and the first transport hand 50A synchronously move in an unloading direction, which is a direction toward the unloading position P3, by one pitch. Specifically, in the second transport hand 50B, the index unit 60B is located at the first test position and the index unit 60A is located at the second test position. The electronic components T (the second electronic components) that are held by the index unit 60B (the second index unit) of the second transport hand 50B are received by the test sockets Sc1 and thus subjected to the first test. Meanwhile, the electronic components T held by the index unit 60A are received by the test sockets Sc2 and subjected to the second test. When the second transport hand 50B and the first transport hand 50A are located adjacently, the interval Lp (one pitch) between the index unit 60C of the first transport hand 50A and the index unit 60C of the second transport hand 50B is maintained.

Figure 7A:
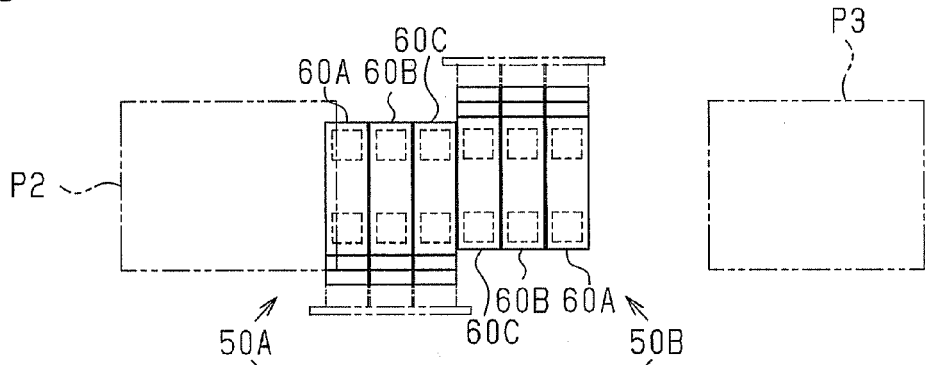
FIG. 7A is a plan view illustrating transport of an electronic component by the component test apparatus of FIG. 1.
Figure 7B:
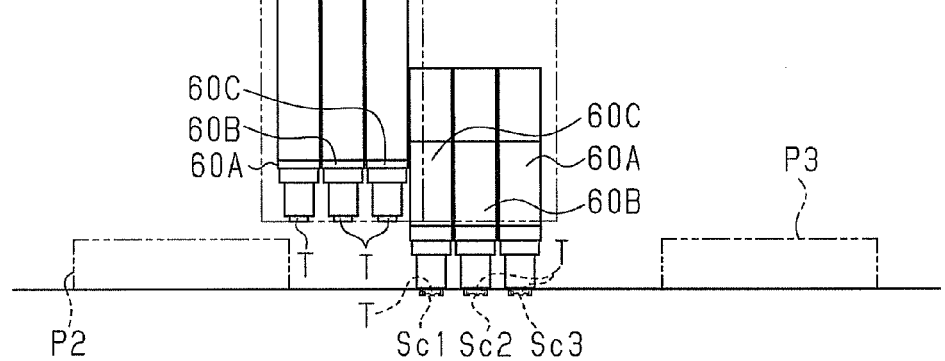
FIG. 7B is a front view of FIG. 7A.

Then, after a predetermined test time elapses and the tests on the electronic components T held by the index units 60A, 60B of the second transport hand 50B are completed, the electronic components T held by the index units 60A, 60B are separated from the test sockets Sc1, Sc2. As illustrated in FIGS. 7A and 7B, the second transport hand 50B and the first transport hand 50A synchronously move in the unloading direction, which is the direction toward the unloading position P3, by one pitch. Specifically, the index unit 60C, the index unit 60B, and the index unit 60C of the second transport hand 50B are arranged at the first test position, the second test position, and the third test position, respectively. In this state, a total of six electronic components T, which are held by the index units 60C to 60A, are received by the corresponding test sockets Sc1 to Sc3 and subjected to the corresponding one of the first to third tests.

Figure 8A:
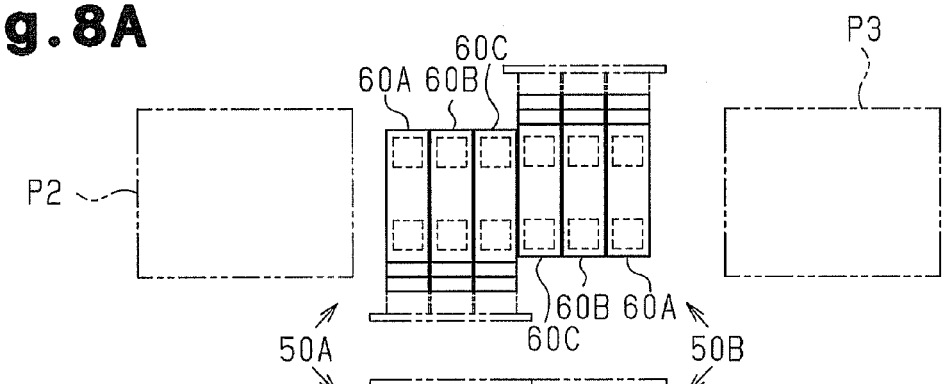
FIG. 8A is a plan view illustrating transport of an electronic component by the component test apparatus of FIG. 1.
Figure 8B:
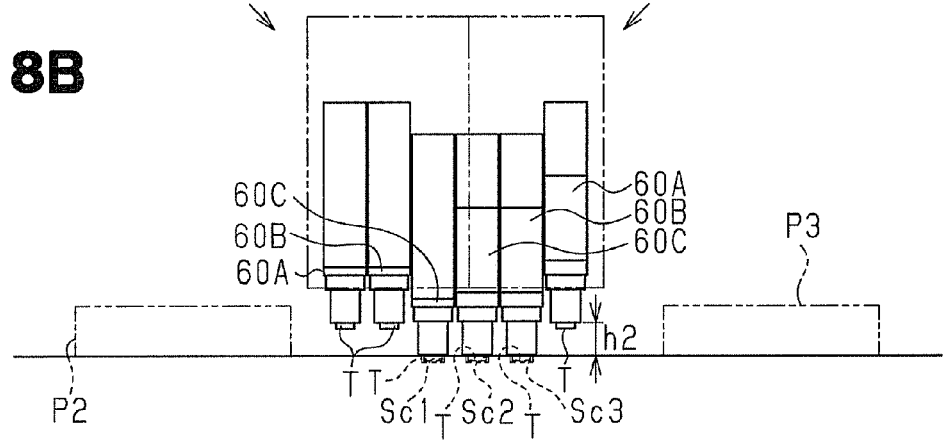
FIG. 8B is a front view of FIG. 8A.

Thereafter, when a predetermined test time has elapsed and the tests on the electronic components T that are held by the index units 60C, 60B, 60A of the second transport hand 50B are completed, the electronic components T held by the index units 60C, 60B, 60A are separated from the corresponding test sockets Sc1, Sc2, Sc3. As illustrated in FIGS. 8A and 8B, the second transport hand 50B and the first transport hand 50A synchronously move in the unloading direction by one pitch. Specifically, the index unit 60C of the second transport hand 50B is located at the second test position and the index unit 60B of the second transport hand 50B is arranged at the third test position. The height of each component holding portion 70 of the index unit 60A of the second transport hand 50B, which holds the electronic component T that has been completed the first to third tests, is regulated to be equal to the second height h2, which is closer to the test sockets Sc1 to Sc3 than the height h1. The heights of the component holding portions 70 of the index units 60A, 60B of the first transport hand 50A are regulated to be equal to the second height h2 and the index unit 60C of the first transport hand 50A is arranged at the first test position. The two electronic components T held by the index unit 60C of the first transport hand 50A are received by the test sockets Sc1 and subjected to the first test. The two electronic components T held by the index unit 60C of the second transport hand 50B are received by the test sockets Sc2 and the two electronic components T held by the index unit 60B of the second transport hand 50B are received by the test sockets Sc3. These electronic components T are then subjected to the corresponding one of the second test and the third test.

Figure 9A:
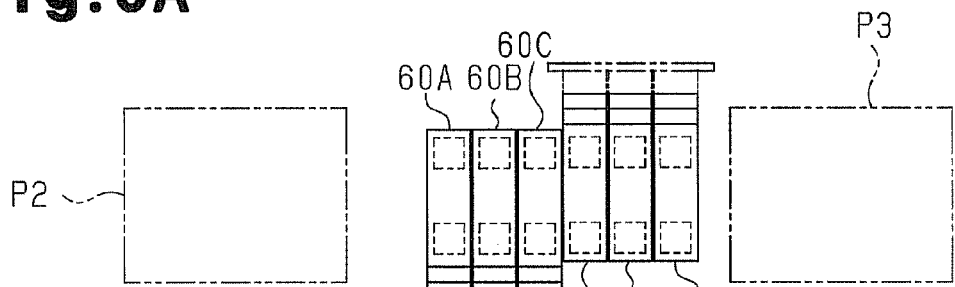
FIG. 9A is a plan view illustrating transport of an electronic component by the component test apparatus of FIG. 1.
Figure 9B:
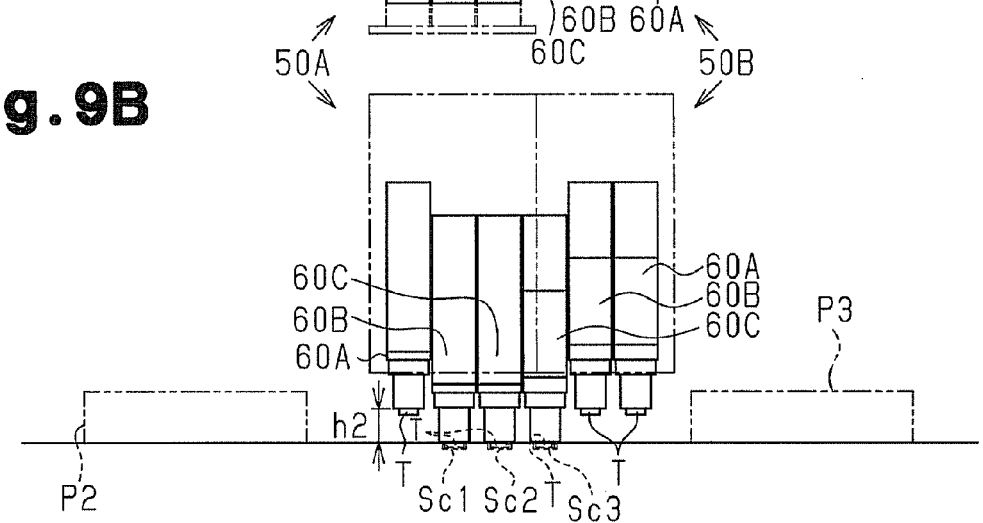
FIG. 9B is a front view of FIG. 9A.

Subsequently, after a predetermined test time elapses and the tests on the electronic components T in the corresponding test sockets Sc1 to Sc3 are completed, the electronic components T are separated from the test sockets Sc1, Sc2, Sc3. As illustrated in FIGS. 9A and 9B, the second transport hand 50B and the first transport hand 50A synchronously move in the unloading direction, which is the direction toward the unloading position P3, by one pitch. Specifically, the index unit 60B of the first transport hand 50A, the index unit 60C of the first transport hand 50A, and the index unit 60C of the second transport hand 50B are located at the first test position, the second test position, and the third test position, respectively. In this state, the two electronic components T held by the index unit 60B of the first transport hand 50A are received by the test sockets Sc1, the two electronic components T held by the index unit 60C of the first transport hand 50A, and the two electronic components T held by the index unit 60C of the second transport hand 50B are received by the test sockets Sc1, the test sockets Sc2, and the test sockets Sc3, respectively. The corresponding tests are then carried out on these electronic components T.

Figure 10A:
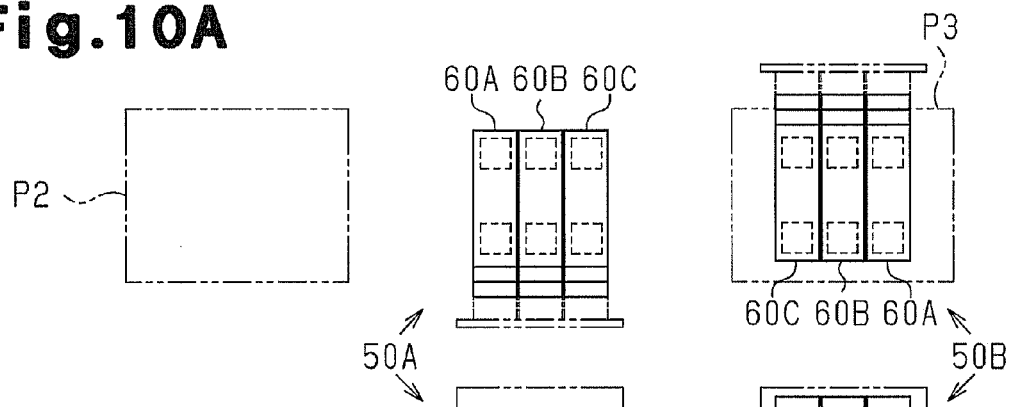
FIG. 10A is a plan view illustrating transport of an electronic component by the component test apparatus of FIG. 1.
Figure 10B:
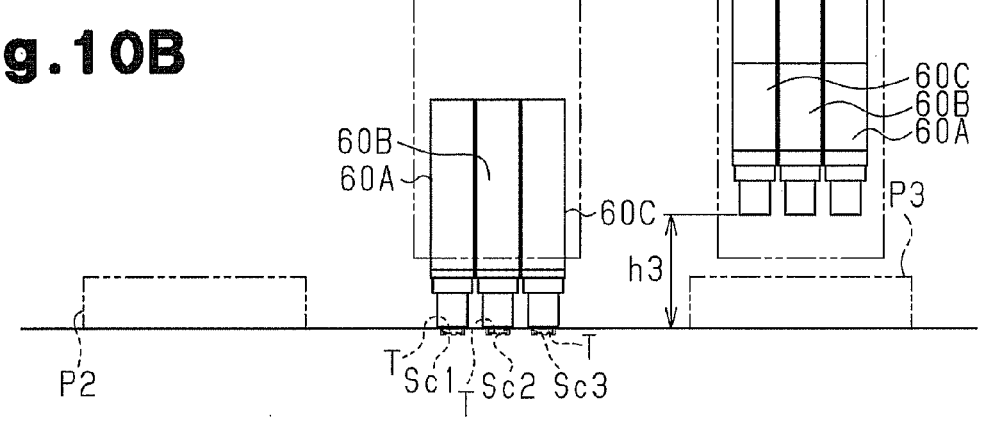
FIG. 10B is a front view of FIG. 10A.

Thereafter, when a predetermined test time has elapsed and the tests on the electronic components T in the corresponding test sockets Sc1 to Sc3 are completed, the electronic components T are separated from the test sockets Sc1, Sc2, Sc3. Then, the second transport hand 50B and the first transport hand 50A synchronously move in the unloading direction by one pitch. Specifically, the index unit 60A, the index unit 60B, and the index unit 60C of the first transport hand 50A are located at the first test position, the second test position, and the third test position, respectively. As a result, each pair of the electronic components T held by the index units 60A, 60B, 60C of the first transport hand 50A are received by the corresponding ones of the test sockets Sc1 to Sc3 and tested. As illustrated in FIGS. 10A and 10B, while the electronic components T held by the index units 60A, 60B, and 60C of the first transport hand 50A are being tested in the test sockets Sc1, Sc2, and Sc3, respectively, the second transport hand 50B, which holds the six electronic components T that have been subjected to all of the tests, is moved to the unloading position P3. At the unloading position P3, the electronic components T that have finished all of the tests are mounted on the unloading tray ET. Further, with the electronic components T held by the index units 60A, 60B, 60C of the first transport hand 50A being tested in the corresponding test sockets Sc1 to Sc3, the second transport hand 50B returns from the unloading position P3 to the loading position P2. At this time, the second transport hand 50B rises from the unloading position P3 to a third height h3, at which the second transport hand 50B does not contact the first transport hand 50A, which is located at the second height h2, and returns to the loading position P2. That is, the position of the first transport hand 50A is replaced by the position of the second transport hand 50B in such a manner that the second transport hand 50B is arranged closer to the unloading position P3 than the first transport hand 50A. In other words, the first transport hand 50A and the second transport hand 50B perform rotary movement. Further, after the second transport hand 50B, which has been moved to the loading position P2, simultaneously holds the six electronic components T that have been supplied to the loading position P2, the heights of the component holding portions 70 of the index units 60A to 60C of the second transport hand 50B are lowered to the first height h1. The second transport hand 50B is then moved toward the first transport hand 50A. At this stage, if the sum of the time necessary for unloading and loading of the electronic components T by means of the second transport hand 50B, which has been described so far, and the time necessary for moving the second transport hand 50B toward the first transport hand 50A is shorter than the time consumed by the electrical test on all of the electronic components T held by the first transport hand 50A, the electronic components T can be thus consecutively subjected to the electrical tests.

The first embodiment has the following advantages.

(1) Each transport hand 50 (50A, 50B) includes the multiple index units 60A to 60C, which are aligned and spaced apart at the intervals each equal to the interval Lp between each adjacent pair of the test sockets Sc1 to Sc3 and operate independently from one another. This reliably ensures enhanced flexibility in mounting of the electronic components T in the test sockets Sc1 to Sc3 by means of the transport hand 50. In other words, even if the number of the electronic components T held by the transport hand 50 is not equal to the number of the electronic components T received by the test sockets Sc1 to Sc3, the index units 60A, 60B, 60C corresponding to the test sockets Sc1 to Sc3 operate independently from one another so that the electronic components T are sequentially arranged in the test sockets Sc1 to Sc3. Also, by sequentially mounting the electronic components T in each one of the test sockets Sc1 (Sc2, Sc3) by the corresponding one of the index units 60A to 60C of the transport hand 50, the transport hand 50 is capable of arranging the electronic components T in the test sockets Sc1 (Sc2, Sc3) consecutively. This minimizes the standby time of the test sockets Sc1 (Sc2, Sc3) before the tests, or the time (the time for replacement) from when the transport hand 50 separates an electronic component T that has been tested from a test socket to when the transport hand 50 mounts an electronic component T that is to be tested in the test socket.

(2) By moving each transport hand 50 sequentially by the distance equal to the interval Lp between the corresponding adjacent pair of the test sockets Sc1 to Sc3, the electronic components T held by the transport hand 50 are received sequentially in the test sockets Sc1 to Sc3, which are spaced apart at the equal intervals and have different functions, in the order corresponding to the index units. That is, even if the number of the electronic components T held by the transport hand 50 is not equal to the number of the electronic components T arranged in the test sockets Sa1 to Sc3, the electronic components T are transported to the rows of the test sockets Sc1 to Sc3 rapidly and easily.

(3) Each of the electronic components T held by the same transport hand 50 can be sequentially received by all the test sockets Sc1 to Sc3. This reliably shortens the time necessary for mounting the electronic components T in the test sockets Sc1 to Sc3. Specifically, the electronic component T that has been received by and tested in the test sockets Sc1 can be transported to and received by the test sockets Sc2 and then tested.

(4) Each transport hand 50 transports the electronic components T held by the index units 60A, 60B, 60C as one unit, and the transport hands 50 (50A, 50B) perform rotary movement relative to each other. The electronic components T are constantly arranged in the test sockets Sc in a sequential manner. Further, while the test time necessary for one transport hand 50 as one unit is elapsing, the other transport hand 50 is allowed to load or unload the corresponding electronic components T. As a result, the throughput of the component test apparatus necessary for arranging the electronic components T in the test sockets Sc1 to Sc3 varies depending on the test time and the replacement time through the test sockets Sc1 to Sc3. The number of the tests that can be performed on each electronic component T per unit time is thus reliably increased. Also, the loading position P2 and the unloading position P3 may be provided as a single common position, which reduces the cost of the facility.

(5) Providing two transport hands 50A, 50B is sufficient for allowing one transport hand 50A (50B) to load and unload electronic components T during the test time of the other transport hand 50B (50A) as one unit. The two transport hands 50A, 50B perform rotary movement in such a manner that the index units 60A, 60B, 60C of one transport hand 50A, 50B and the index units 60A, 60B, 60C of the other transport hand 50A, 50B vertically pass each other while facing each other. This greatly saves the two dimensional area for installing the component test apparatus.

A second embodiment of the component test apparatus and the component transport method according to the present invention will hereafter be described with reference to FIGS. 11A to 12B mainly about the differences between the second embodiment and the first embodiment. Same or like reference numerals are given to components of FIGS. 11A to 12B that are the same as or like the corresponding components of the first embodiment. In the component test apparatus according to the second embodiment, the contents of the electrical tests performed in the test sockets Sc1 to Sc6 are identical. In other words, the test sockets Sc1 to Sc6 function identically so that identical tests are carried out on the electronic components T. The loading position P2 is used to selectively load and unload the electronic components T with respect to the first transport hand 50A. The unloading position P3 is used to selectively load and unload the electronic components T with respect to the second transport hand 50B.

First, as illustrated in FIGS. 11A and 11B, the first transport hand 50A is arranged at the loading position P2 and the component holding portions 70 of the first transport hand 50A hold the electronic components T that are held in a standby state before a test. The second transport hand 50B is located at the unloading position P3 and the component holding portions 70 of the second transport hand 50B hold the electronic components T that are maintained in a standby state before a test. In the second embodiment, the index unit 60A, the index unit 60B, and the index unit 60C of the first transport hand 50A correspond to the test sockets Sc1, the test sockets Sc2, and the test sockets Sc3, respectively. The index unit 60C, the index unit 60B, and the index unit 60A of the second transport hand 50B correspond to the test sockets Sc4, the test sockets Sc5, and the test sockets Sc6, respectively. In other words, in the second embodiment, the number of the electronic components T held by the transport hands 50A, 50B is equal to the number of the functional stations (the test sockets Sc1 to Sc6) provided in the component test portion 10.

Subsequently, with reference to FIGS. 12A and 12B, the first transport hand 50A and the second transport hand 50B, both holding the electronic components T, simultaneously move to a test position. Specifically, the first transport hand 50A moves toward the unloading position P3 so that the index unit 60A, the index unit 60B, and the index unit 60C of the first transport hand 50A are arranged in correspondence with the test sockets Sc1, the test sockets Sc2, and the test sockets Sc3, respectively. The second transport hand 50B moves toward the loading position P2 so that the index unit 60C, the index unit 60B, and the index unit 60A of the second transport hand 50B are arranged in correspondence with the test sockets Sc4, the test sockets Sc5, and the test sockets Sc6, respectively. Then, the electronic components T held by the index units 60A to 60C of the transport hands 50A, 50B are received by the corresponding test sockets Sc1 to Sc6 and all of the electronic components T are tested simultaneously. After the test, transport of the electronic components T illustrated in FIGS. 11A to 12B is repeated so that the electronic components T are unloaded, loaded, and then tested in a repeated manner.

The second embodiment has the following advantage in addition to the advantage (1) of the first embodiment.

(6) The two transport hands 50A, 50B cooperate to transport the electronic components T, which are to be received by the test sockets Sc1 to Sc6 that function identically. As a result, even if the number of the electronic components T that can be held by the transport hands 50A, 50B is not equal to the number of the electronic components T received by the test sockets Sc1 to Sc6, the electronic components T are transported rapidly to the multiple test sockets Sc1 to Sc6. Also, transport of the electronic components T in correspondence with the number of the test sockets Sc1 to Sc6 is facilitated.

A third embodiment of the component test apparatus and the component transport method according to the present invention will hereafter be described with reference to FIGS. 13A to 15B mainly about the differences between the second embodiment and the first embodiment. Same or like reference numerals are given to components of FIGS. 13A to 15B that are the same as or like the corresponding components of the first embodiment and explanation thereof is omitted. In the component test apparatus according to the third embodiment, the contents of the electrical tests performed in the test sockets Sc1, Sc2 are identical. In other words, the test sockets Sc1, Sc2 function identically and identical tests are carried out on the electronic components T.

Figure 13A:
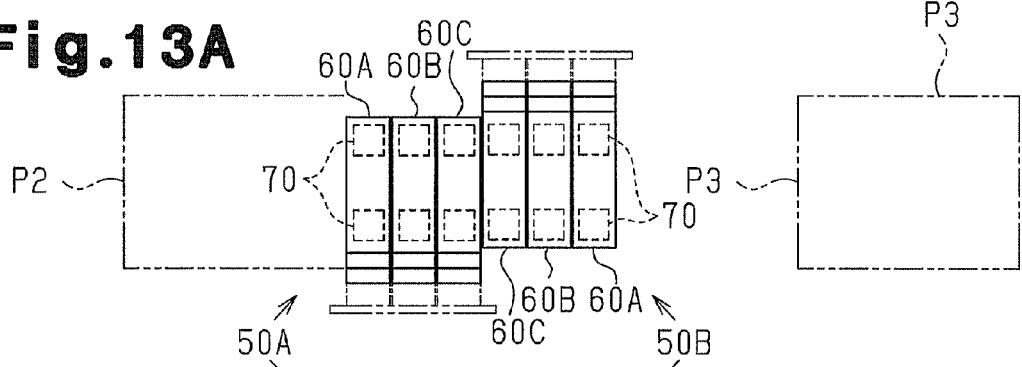
FIG. 13A is a plan view illustrating transport of electronic components by a component test apparatus according to a third embodiment of the present invention.
Figure 13B:
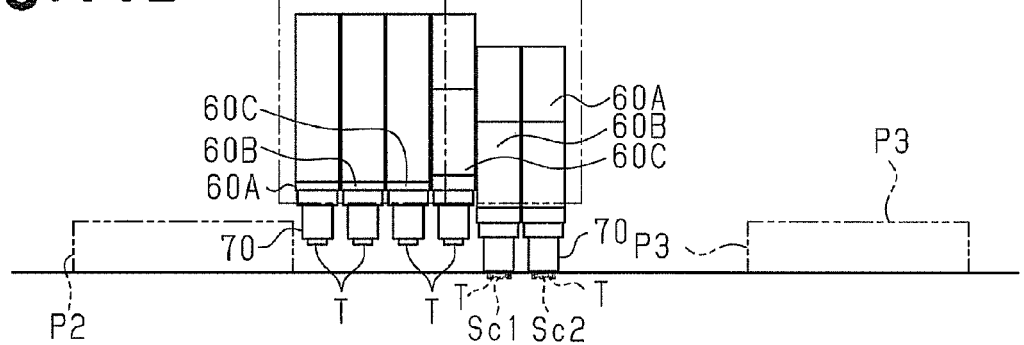
FIG. 13B is a front view of FIG. 13A.

First, as illustrated in FIG. 13A, the electronic components T held by the index units 60B, 60A of the second transport hand 50B are received by the corresponding test sockets Sc1, Sc2 and subjected to the identical tests. At this stage, the first transport hand 50A is held in a standby state at the position adjacent to the second transport hand 50B. In other words, the index unit 60C of the first transport hand 50A approaches the index unit 60C of the second transport hand 50B until the interval between the index units 60C is equal to the interval Lp (one pitch).

Figure 14A:
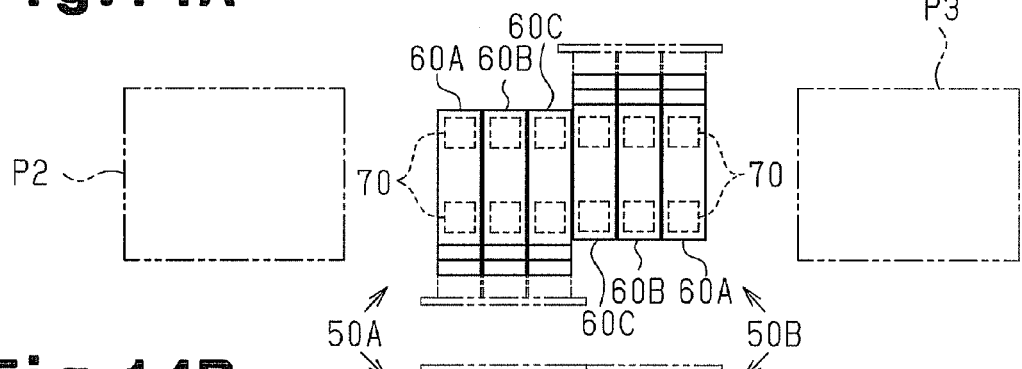
FIG. 14A is a plan view illustrating transport of electronic components by the component test apparatus shown in FIG. 13A.
Figure 14B:
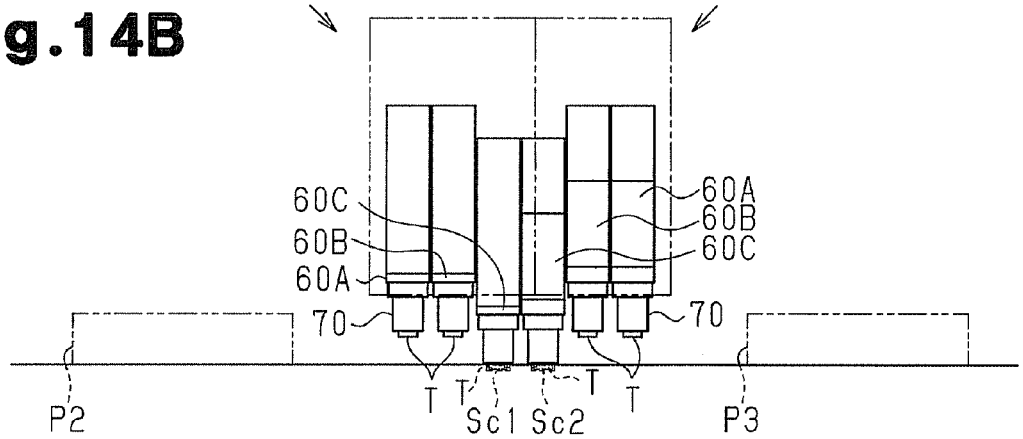
FIG. 14B is a front view of FIG. 14A.

After a predetermined test time elapses and the tests on the electronic components T held by the index units 60B, 60A of the second transport hand 50B are completed, the electronic components T are separated from the test sockets Sc1, Sc2. As illustrated in FIGS. 14A and 14B, the second transport hand 50B and the first transport hand 50A synchronously move toward the unloading position P3 by two pitches. Specifically, the index unit 60C of the second transport hand 50B is located at the test position corresponding to the test sockets Sc2 and the index unit 60C of the first transport hand 50A are arranged at the test position corresponding to the test sockets Sc1. In this state, the electronic components T held by the index unit 60C of the second transport hand 50B are received by and tested in the test sockets Sc1 and the electronic components T held by the index unit 60C of the first transport hand 50A are received by and tested in the test sockets Sc2.

Thereafter, when a predetermined test time has elapsed and the tests on the electronic components T held by the index units 60A, 60B of the second transport hand 50B are completed, the electronic components T held by the index units 60A, 60B are separated from the test sockets Sc1, Sc2. Then, as illustrated in FIGS. 15A and 15B, the second transport hand 50B and the first transport hand 50A synchronously move toward the unloading position P3 by two pitches. Specifically, the index unit 60A of the first transport hand 50A is located at the test position corresponding to the test sockets Sc1 and the index unit 60B of the first transport hand 50A are arranged at the test position corresponding to the test sockets Sc2. Then, the electronic components T held by the index unit 60A of the first transport hand 50A are received by the test sockets Sc1 and the electronic components T held by the index unit 60B are received by the test sockets Sc2. While the electronic components T held by the index units 60A, 60B, 60C of the first transport hand 50A are being tested in the corresponding test sockets Sc1, Sc2, the second transport hand 50B, which holds the electronic components T that have completed the tests, moves to the unloading position P3 and, at the unloading position P3, mounts all of the electronic components T that have been tested on the unloading tray ET. Meanwhile, the second transport hand 50B rises from the unloading position P3 to a third height at which the second transport hand 50B is prevented from interfering with the first transport hand 50A, which is located at the second height h2, and returns to the loading position P2. In other words, the position of the first transport hand 50A and the position of the second transport hand 50B are switched in such a manner that the second transport hand 50B is located closer to the unloading position P3 than the first transport hand 50A. That is, the first transport hand 50A and the second transport hand 50B perform rotary movement. Also, the second transport hand 50B holds the electronic components T that have been supplied to the loading position P2 and then descends until the height of the component holding portions 70 of each index unit 60A to 60C of the second transport hand 50B is equal to the first height h1. In this state, the second transport hand 50B is located adjacently to the first transport hand 50A.

The third embodiment has the following advantages in addition to the advantages (1) to (5) of the first embodiment.

(7) Even if the number of the electronic components T that can be held by the index units 60A to 60C of the transport hands 50A, 50B is greater than the number of the electronic components T to be received by the test sockets Sc1, Sc2, which function identically, a necessary number of electric components T are rapidly transported to the test sockets Sc1, Sc2. Also, transport of the electronic components T in correspondence with the number of the test sockets Sc1 to Sc6 is facilitated.

(8) Through cooperation of the two transport hands 50A, 50B, the electronic components T are constantly arranged in the test sockets Sc1, Sc2 in a sequential manner. This reliably increases the number of the tests carried out on the electronic components T by the component test apparatus per unit time.

The illustrated embodiments may be modified as follows.

As long as each test socket Sc1 to Sc3 (Sc1 to Sc6, Sc1, Sc2), which is a functional station, is shaped in such a manner as to ensure electrical connection between the test socket and an electrode of an electronic component such as an IC, the shape of the test socket is not restricted to those of the illustrated embodiments. Each test socket Sc1 to Sc3 (Sc1 to Sc6, Sc1, Sc2) may be a functional station including an imaging device such as a CCD imaging element.

Since the heights of the index units 60A to 60C are adjustable independently from one another, the heights of the functional stations located at the test positions may be different from one another. In this case, sockets and imaging devices can be provided in the functional stations in a mixed manner. As a result, the component test apparatus has improved flexibility and broader usability.

The number or the test sockets Sc1 to Sc3 (Sc1 to Sc6, Sc1, Sc2), or the functional stations, may be one or three or greater. Correspondingly, the number of the component holding portions 70 formed in each index unit 60A to 60C may be one or three or greater.

In the first embodiment, the number of the functional stations (the test sockets Sc1 to Sc3), which have different functions, is not restricted to any number.

In the second embodiment, the number of the electronic components T that can be held by the transport hand 50A, 50B may be different from the number of the functional stations provided in the component test portion 10.

In the third embodiment, if the number, or the number of the rows, of the electronic components that can be held by each transport hand 50A, 50B as counted along the movement direction of the transport hand 50A, 50B is greater than the number, or the number of the rows, of the functional stations as counted along the longitudinal direction of the base 1, the advantages equivalent to the advantages of the third embodiment are obtained.

In each of the illustrated embodiments, each component holding portion 70 includes the suction mechanism 72 and the pressing mechanism 71. However, the present invention is not restricted to this. That is, basically, the component holding portion 70 may include any suitable mechanism as long as the mechanism is capable of holding an electronic component T and pressing the electronic component T into a test socket.

In the second embodiment, the transport hand 50A selectively loads and unloads the electronic components T at the loading position P2 and the transport hand 50B selectively loads and unloads the electronic components T at the unloading position P3. However, the present invention is not restricted to this. That is, the transport hands may both hold the electronic components T at the loading position P2 and unload the electronic components T at the unloading position P3. Specifically, the transport hands may substantially simultaneously hold the electronic components T at the loading position P2, cooperate to mount the electronic components T in the corresponding functional stations (the corresponding test sockets), and substantially simultaneously unload the electronic components T at the unloading position P3. In this manner, the electronic components T are received smoothly in the functional stations (the test sockets) that are provided by a number greater than the number of the electronic components T held by each transport hand.

In the first and third embodiments, the component transport line is defined by arranging the loading position P2, the test position, and the unloading position P3 in this order. However, the present invention is not restricted to this. The component transport line may be defined by arranging the positions in any suitable order, which is, for example, the unloading position, the loading position, and the test position, or the loading position, the unloading position, and the test position. Also, the loading position and the unloading position do not necessarily have to be located separately from each other but may be arranged at a common position. In this case, the component loading device and the component unloading device may be provided as a common device.

In the illustrated embodiments, each transport hand 50A, 50B reciprocates along the component transport line. However, the present invention is not restricted to this. That is, after having moved from the loading position to the test position and then to the unloading position, the transport hand may move along a different path to return to the loading position. In this case, the path of the transport hand may be, for example, a curved path, a rotary path revolving on a plane, or a rotary path such as a belt conveyor. Also, each transport hand does not necessarily have to perform rotary movement.

Only one transport hand 50 may be provided. As long as the transport hand 50 includes a plurality of index units arranged adjacently, the time required for replacement of the electronic components with respect to the test sockets is shortened. Alternatively, three or more transport hands 50 may be employed. Particularly, in the second embodiment, there may be three or more transport hands 50. For example, two transport hands 50, which perform rotary movement relative to each other, may be provided at the side corresponding to the loading position P2, and two other transport hands 50, which perform rotary movement relative to each other, may be arranged at the side corresponding to the unloading position P3. In this case, the electronic components T are consecutively arranged in the functional stations.

As long as multiple index units are formed in each transport hand 50, the index units may be provided by any suitable number.

In the first embodiment, one from each pair of the functional stations (the test sockets Sc1 to Sc3) is aligned in the longitudinal direction of the base 1. However, the present invention is not restricted to this. That is, multiple ones of each type of functional stations may be aligned along the longitudinal direction of the base 1. In this case, movement of the transport hands 50A, 50B, including selective ascent and descent of the index units 60A, 60C, is carried out by combining the transport method of the electronic components of the first embodiment with the transport method of the electronic components T of the third embodiment, according to which a plurality of index units are treated as one unit. Further, each index unit may be configured in such a manner as to hold electronic components in correspondence with the aforementioned alignment of the functional stations. Also, the electronic components may be transported in the component test apparatus by combining the transport methods of the electronic components of the illustrated embodiments.

In the second embodiment, the two transport hands are moved to the component test portion 10 from different sides. However, the present invention is not restricted to this. The transport hands may be moved toward the component test portion 10 from a common side, which is, for example, the side corresponding to the loading position P2. Specifically, one of the transport hands is arranged in correspondence with the functional stations (the test sockets to Sc6) that are located closer to the unloading position P3, with the other one of the transport hands provided in correspondence with the functional stations (the test sockets Sc1 to Sc3) that are located closer to the loading position P2.

What is claimed is:

1. A component test apparatus performing a test on an electronic component, the apparatus comprising:
    a component loading device that loads the electronic component to a loading position;
    a transport hand capable of holding the electronic component so as to transport the electronic component from the loading position to a plurality of functional stations arranged a test position, and to transport the tested electronic component from the functional stations to an unloading position; and
    a component unloading device that unloads the electronic component from the unloading position,
    wherein the functional stations have mutually different functions and are spaced apart at equal intervals along a movement direction of the transport hand, and
    wherein the transport hand includes a plurality of index units each one of which is capable of holding the electronic component and operating independently from the other ones of the index units, the index units being spaced apart at intervals equal to the intervals at which the functional stations are spaced apart along a transport direction of the electronic component from the loading position toward the test position.

2. The component test apparatus according to claim 1, wherein the transport hand is one of a plurality of transport hands, and wherein the transport hands are capable of performing rotary movement relative to one another.

3. The component test apparatus according to claim 2, wherein the number of the transport hands is two, and wherein the two transport hands perform rotary movement in such a manner that the index units of one of the transport hands and the index units of the other transport hands vertically passes each other while facing each other.

4. A component transport method carried out by a component test apparatus that performs a test on an electronic component, the component test apparatus including a component loading device that loads the electronic component to a loading position, a transport hand capable of holding the electronic component so as to transport the electronic component from the loading position to a plurality of functional stations located at a test position, and to transport the tested electronic component from the functional stations to an unloading position, and a component unloading device that unloads the electronic component from the unloading position, the method comprising:
    arranging the functional stations having mutually different functions to be spaced apart at equal intervals along a movement direction of the transport hand;
    providing, in the transport hand, a plurality of index units that are capable of holding the electronic component independently from one another and operating independently from one another;
    arranging a first electronic component held by a first index unit of the index units in a first functional station of the functional stations;
    performing the test on the first electronic component arranged in the first functional station;
    moving the transport hand along the movement direction by a distance equal to the interval between each adjacent pair of the functional stations after the test; and
    arranging a second electronic component held by a second index unit adjacent to the first index unit in the first functional station, and arranging the first electronic component held by the first index unit in a second functional station adjacent to the first functional station.

5. The component transport method according to claim 4, further comprising:
    providing at least first and second transport hands that are capable of performing rotary movement relative to each other;
    arranging the second transport hand at a position adjacent to the first transport hand, while arranging the electronic component held by at least one of the index units of the first transport hand in a corresponding one of the functional stations;
    performing the test on the electronic component arranged in the functional station; and
    arranging, after the test, the electronic component held by the at least one of the index units of the second transport hand in the corresponding functional station by moving the first transport hand and the second transport hand along the movement direction.

6. A component transport method carried out by a component test apparatus that performs a test on an electronic component, the component test apparatus including a component loading device that loads the electronic component to a loading position, two transport hands each capable of holding the electronic component so as to transport the electronic component from the loading position to a plurality of functional stations located at a test position, and to transport the tested electronic component from the functional stations to an unloading position, and a component unloading device that unloads the electronic component from the unloading position, the method comprising:
    arranging the functional stations having identical functions to be spaced apart at equal intervals along a movement direction of the transport hands;
    providing, in each transport hand, a plurality of index units that are capable of holding the electronic component independently from one another and operating independently from one another, the index units of each transport hand being spaced apart at intervals equal to the intervals at which the functional stations are spaced apart along a transport direction of the electronic component from the loading position to the test position;
    assigning the electronic components held by the two transport hands to the functional stations; and
    arrange the electronic components held by the two transport hands in the functional stations to which the electronic component have been assigned through cooperation of the two transport hands.

7. A component transport method carried out by a component test apparatus that performs a test on an electronic component, the component test apparatus including a component loading device that loads the electronic component to a loading position, a transport hand capable of holding the electronic component so as to transport the electronic component from the loading position to a plurality of functional stations located at a test position, and to transport the tested electronic component from the functional stations to an unloading position, and a component unloading device that unloads the electronic component from the unloading position, the method comprising:
    arranging the functional stations having identical functions to be spaced apart at equal intervals along a movement direction of the transport hand;
    providing, in the transport hand, a plurality of index units that are capable of holding the electronic component independently from one another and operating independently from one another;
    holding a greater number of electronic components than the functional stations by means of the index units; and
    arranging, through independent operations of one or more of the index units that correspond to one or more of the functional stations, the electronic components held by said one or more of the index units in the corresponding functional stations.

8. The component transport method according to claim 7, further comprising:
    providing at least first and second transport hands that are capable of performing rotary movement relative to each other; and
    arranging the electronic component held by at least one of the index units of the first transport hand in some of the functional stations, and arranging the electronic component held by at least one of the index units of the second transport hand in another functional station.

* * * * *